US009484772B2

(12) United States Patent
Lo et al.

(10) Patent No.: US 9,484,772 B2
(45) Date of Patent: Nov. 1, 2016

(54) WIRELESS POWER MECHANISMS FOR LAB-ON-A-CHIP DEVICES

(75) Inventors: Yu-Hwa Lo, San Diego, CA (US); Wen Qiao, La Jolla, CA (US)

(73) Assignee: The Regents Of The University Of California, Oakland, CA (US)

( * ) Notice: Subject to any disclaimer, the term of this patent is extended or adjusted under 35 U.S.C. 154(b) by 780 days.

(21) Appl. No.: 13/884,594

(22) PCT Filed: Nov. 9, 2011

(86) PCT No.: PCT/US2011/060061
§ 371 (c)(1),
(2), (4) Date: Jul. 16, 2013

(87) PCT Pub. No.: WO2012/064896
PCT Pub. Date: May 18, 2012

(65) Prior Publication Data
US 2013/0285477 A1    Oct. 31, 2013

Related U.S. Application Data

(60) Provisional application No. 61/411,896, filed on Nov. 9, 2010.

(51) Int. Cl.
*H01F 27/42*    (2006.01)
*H02J 17/00*    (2006.01)
*H01L 25/16*    (2006.01)
*H04B 5/00*     (2006.01)

(52) U.S. Cl.
CPC ............. *H02J 17/00* (2013.01); *H01L 25/167* (2013.01); *H01L 2924/0002* (2013.01); *H04B 5/0031* (2013.01); *H04B 5/0037* (2013.01)

(58) Field of Classification Search
CPC . H02J 17/00; H01L 25/167; H01L 2924/002
USPC .................. 307/104, 151; 327/104, 514, 187
See application file for complete search history.

(56) References Cited

U.S. PATENT DOCUMENTS

| 5,431,159 | A  | * | 7/1995  | Baker  | A61B 5/14551 356/41 |
| 5,583,477 | A  | * | 12/1996 | Yen    | G08B 3/10 116/148 |
| 6,687,451 | B1 | * | 2/2004  | Sikora | G02F 1/0123 398/187 |
| 8,093,823 | B1 | * | 1/2012  | Ivey   | F21K 9/17 315/246 |
| 2013/0193003 | A1 | * | 8/2013 | Reed   | B01L 3/502707 205/775 |

* cited by examiner

*Primary Examiner* — Viet Q Nguyen
(74) *Attorney, Agent, or Firm* — Perkins Coie LLP

(57) ABSTRACT

Methods, devices and systems are provided for wirelessly powering and controlling a lab-on-a-chip device. Direct current (DC) and alternating current (AC) signals can be produced at the lab-on-a-chip device in a wireless manner. In some configurations, integrated RF components and optoelectronic components of the lab-on-a-chip device are used to collaboratively produce the DC and AC signals. In other configurations only optoelectronic components on the lab-on-a-chip system can produce the DC and/or AC signals in response to incident light. By modulating the incident light, AC signals of various frequencies and waveforms can be generated. The DC and AC signals can be used by additional integrated electronic circuits and by a microfluidic chip lactated on the lab-on-a-chip device to control the behavior of the bioparticles in the microfluidic device.

28 Claims, 12 Drawing Sheets

WIRELESS POWER MECHANISMS FOR LAB-ON-A-CHIP DEVICES

CROSS REFERENCE TO RELATED APPLICATIONS

This patent application claims the benefit of U.S. Provisional Application No. 61/411,896, filed Nov. 9, 2010, which is incorporated by reference in its entirety as part of the disclosure of this document.

TECHNICAL FIELD

The present application generally relates to chemical or biological sensing, diagnostic or processing devices, including devices, methods and materials related to lab-on-a-chip systems.

BACKGROUND

Over the past decades, microfluidic devices have been developed rapidly with the intention of shrinking bench top biological instruments into chips that can produce results faster while consuming fewer amounts of reagents and generating less wastes and hazardous materials. The so-called lab-on-a-chip devices provide advantages that include low cost, high portability, and easy operation. Direct current (DC) and alternating current (AC) power are widely used in these lab-on-a-chip devices to control the behavior and properties of bioparticles (e.g. cells, bacteria, virus, proteins, DNAs, etc.) in the microfluidic channels. For example, AC and/or DC power can provide localized heating, fluid mixing, and bio-particle handling such as cell sorting, trapping and positioning, cell stretching and lysing. The interactions between the electrical signals and cells and biomolecules also enable unique functions for diagnosis and cellular engineering, including cell impedance measurements (e.g. Coulter counter), electroporation, control of ion channels and membrane potential, neural excitation and detection, and the like. To facilitate the operation of microfluidic devices for different applications, electrical signals of specific amplitudes, waveforms and frequencies are needed to produce the desired effects.

SUMMARY

Techniques, structures, apparatus and materials are disclosed for wirelessly powering and controlling a lab-on-a-chip device. One aspect of the disclosed embodiments relates to a lab-on-a-chip device that includes a microfluidic chip, an antenna that is configured to receive a radio frequency (RF) signal and to produce a first alternating current (AC) signal, and a rectifier that is configured to convert the first AC signal into a direct current (DC) signal. The lab-on-a-chip system further includes one or more photoconductive components that are each configured to operate as a switch to convert the DC signal into an AC signal when illuminated by a modulated light, and to provide the AC signal to the microfluidic chip.

In one exemplary embodiment, the antenna is configured to receive the RF signal from a wireless RF transmitter located outside the lab-on-a-chip device and configured to transmit the RF signal to the antenna. In another exemplary embodiment, the modulated light is produced by one or more external light sources located outside the lab-on-a-chip device that are configured illuminate the one or more photoconductive components. For example, the one or more external light sources can include at least one of a light-emitting diode and a semiconductor laser diode. According to another exemplary embodiment, the modulated light is an intensity-modulated light. In yet another exemplary embodiment, the AC signal produced by each of the one or more photoconductive components has a similar waveform as intensity of the modulated light incident upon the corresponding photoconductive component.

In one exemplary embodiment, the one or more photoconductive components are configured to produce a plurality of AC signals each having a different frequency. In another exemplary embodiment, the one or more photoconductive components are configured to produce the AC signal at one particular frequency. In still another exemplary embodiment, a frequency of the AC signal(s) produced by the one or more photoconductive components depends on a frequency of the modulated light and a time contestant associated with resistive and capacitive elements of the lab-on-a-chip device.

According to another exemplary embodiment, the microfluidic chip is configured to receive a particular DC signal from at least one of: the rectifier and the one or more photoconductive components. In another exemplary embodiment, the lab-on-a-chip further includes additional integrated circuits configured to process data obtained from the microfluidic chip and to provide the processed data to the antenna for wireless transmission to an RF transceiver. In one exemplary embodiment, the RF transceiver is a radio frequency identification (RFID) transceiver configured to receive the data in accordance with RFID protocols.

In one exemplary embodiment, the one or more photoconductive components comprise one or more semiconductors or polymers. In another exemplary embodiment, the one or more photoconductive components comprise hydrogenated amorphous silicon (a-Si:H) layer. In one example embodiment, the a-Si:H layer can be placed between a heavily doped a-Si:H layer and one of a silicon nitride or a silicon oxide layer. In another example embodiment, the heavily doped a-Si:H layer facilitates transport of photo-excited carriers, and the silicon nitride or a silicon oxide layer operates as an insulating layer and a blocking capacitor to remove a DC level shift associated with the AC signal that is produced by the one or more photoconductive components. In yet another example embodiment, the a-Si:H layer, the heavily doped a-Si:H layer and the silicon nitride or silicon oxide layers are fabricated using one of: a chemical vapor deposition technique, a plasma-enhanced chemical vapor deposition (PECVD) technique, and a hot-wire chemical vapor deposition (HWCVD) technique. In still another exemplary embodiment, the heavily doped a-Si:H layer is connected to a top indium-tin oxide (ITO) electrode and the silicon nitride or silicon oxide layer is connected to a bottom metal electrode.

According to one exemplary embodiment, the one or more photoconductive components comprise a thin film of heterojunction (BHJ) polymer. In one exemplary embodiment, the thin film of heterojunction (BHJ) polymer comprises a mixture of P3HT:PCBM. In another exemplary embodiment, the thin film of heterojunction (BHJ) polymer is configured to generate photo-induced charge carriers by transfer of excitons at a donor/acceptor interface. In yet another exemplary embodiment, the one or more photoconductive components further comprise a lithium fluoride (LiF) layer that is configured to serve as a protection layer to prevent exposure of the thin film of heterojunction (BHJ) polymer to water and oxygen. In still another exemplary embodiment, the one or more photoconductive components further comprise a conductive polymer PEDOT:PSS layer configured to provide an interfacial buffer layer to smoothen roughness of a metal electrode. In another exemplary embodiment, the mixture of P3HT:PCBM thin film is spin-coated at a relatively low temperature.

According to one exemplary embodiment, the one or more photoconductive components are fabricated over a large-area or on flexible polymer substrates through a continuous roll-to-roll coating process. In another exemplary embodiment, conjugated polymers with different bandgap structures are fine-tuned by replacing the P3HT with PCBM as a photoconductive layer to alter a spectral response of each of the one or more photoconductive components. In still another exemplary embodiment, the microfluidic chip is configured to utilize the DC signal to produce an electrophoresis (EP) effect to drive charged biomolecules in the microfluidic chip.

Another aspect of the disclosed embodiments relates to a method for wirelessly powering a lab-on-a-chip device. This method includes receiving a radio frequency (RF) signal that is generated outside of the lab-on-a-chip device at an antenna located on a lab-on-a-chip device, producing a first alternating current (AC) signal from the received RF signal and rectifying the first AC signal, using a rectifier located on the lab-on-a-chip device, to produce a direct current (DC) signal that is provided to one or more photoconductive components located on the lab-on-a-chip device. The above noted method further includes illuminating each of the one or more photoconductive components with a modulated light, where the modulated light causes each illuminated photoconductive component to convert the DC signal into an AC signal, and supplying the AC signal to power a microfluidic chip located on the lab-on-a-chip device.

Another aspect of the disclosed embodiments relates to a lab-on-a-chip device that includes a microfluidic chip, one or more photovoltaic components that are configured to produce a direct current (DC) signal in response to excitation light incident upon each illuminated photovoltaic component, and to provide the DC signal to the microfluidic chip. The lab-on-a-chip system further includes one or more photoconductive components that are each configured to convert the DC signal into an alternating current (AC) signal when illuminated by a modulated light, and to provide the AC signal to the microfluidic chip. In one exemplary embodiment, the excitation light has a substantially constant intensity.

Another aspect of the disclosed embodiments relates to a method that includes illuminating one or more photovoltaic components located on a lab-on-a-chip device with a light with substantially constant intensity, where the light with substantially constant intensity causes each illuminated photovoltaic component to produce a direct current (DC) signal that is provided to one or more photoconductive components located on the lab-on-a-chip device. This method further includes illuminating the one or more photoconductive components with a modulated light, where the modulated light causes each illuminated photoconductive component to convert the DC signal into an alternating current (AC) signal, and supplying a microfluidic chip located on the lab-on-a-chip device with the DC signal(s) and the AC signal(s).

Another aspect of the disclosed embodiments relates to a lab-on-a-chip device that includes a microfluidic chip and a first set of one or more photovoltaic components that are configured to produce a direct current (DC) signal in response to excitation light incident upon the one or more photovoltaic components in the first set, and to provide the DC signal to the microfluidic chip. The above noted lab-on-a-chip system also includes a second set of or more one or more photovoltaic components that are configured to produce an alternating current (AC) signal in response to modulated light incident upon an illuminated photovoltaic component of the second set, and to provide the AC signal to the microfluidic chip to power one or more components therein.

Another aspect of the disclosed embodiments relates to a method that includes illuminating a first set of one or more photovoltaic components located on a lab-on-a-chip device with a light with substantially constant intensity, where the light with substantially constant intensity causes each illuminated photovoltaic component in the first set to produce a direct current (DC) signal. This method further includes illuminating a second set of one or more photovoltaic components located on the lab-on-a-chip device with a modulated light, where the modulated light causes each illuminated photovoltaic component in the second set to produce an alternating current (AC) signal. The above method also includes supplying a microfluidic chip located on the lab-on-a-chip device with the DC signal(s) and the AC signal(s).

Another aspect of the disclosed embodiments relates to an electrical signal generator located on a lab-on-a chip device that includes one or more photovoltaic components that are configured to produce a direct current (DC) signal in response to receiving an excitation light of substantially constant intensity, and one or more photoconductive components that are configured to produce an alternating current (AC) signal from the DC signal in response to receiving a modulated light. In one exemplary embodiment, the electrical signal generator further includes an antenna integrated into the lab-on-a chip device and configured to produce a second alternating current (AC) signal from a received radio frequency (RF) signal, and a rectifier integrated into the lab-on-a chip device that is configured to convert the second AC signal into one or more additional DC signals.

DETAILED DESCRIPTION

Figure 1:
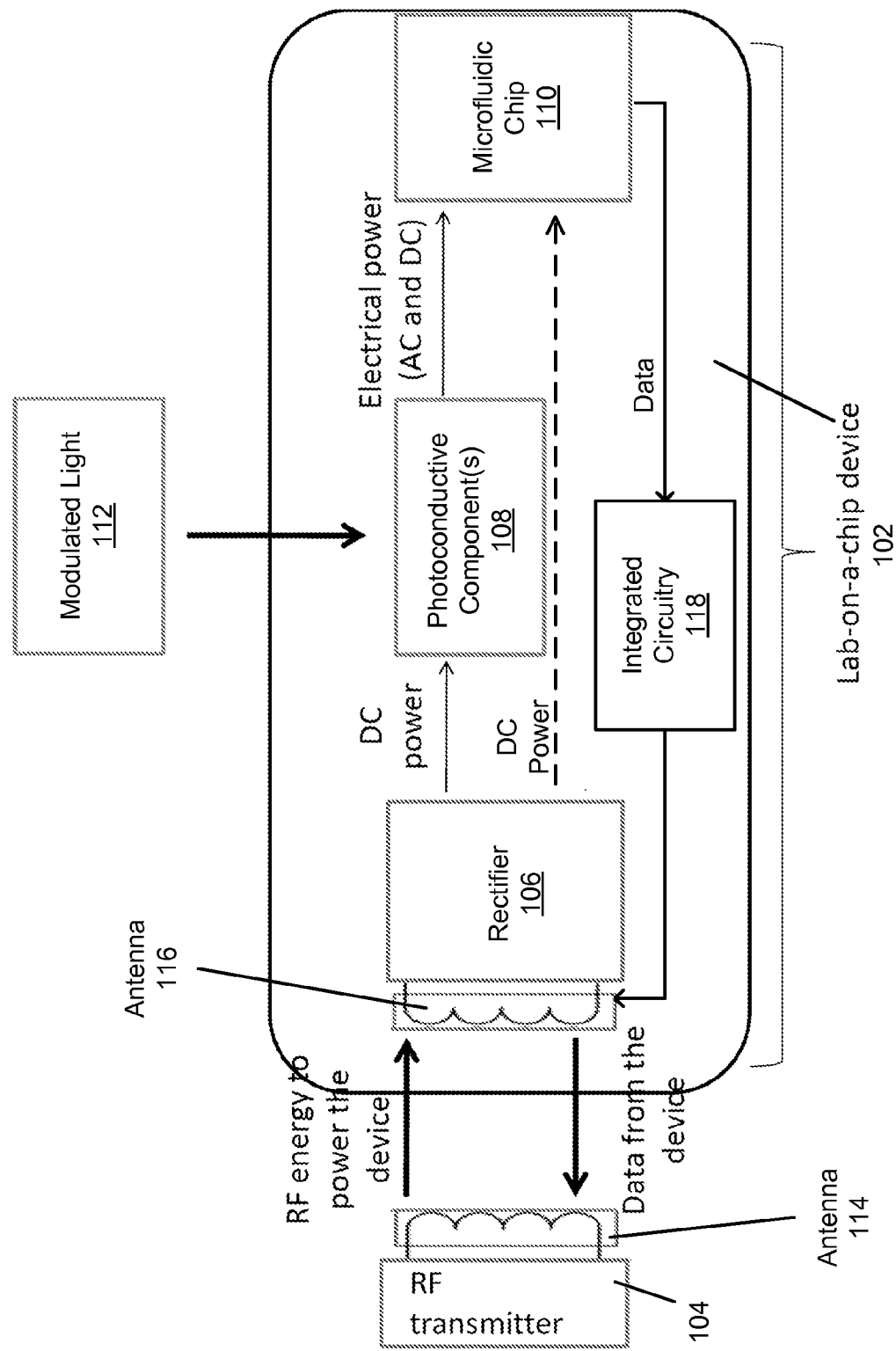
FIG. 1 illustrates a lab-on-a-chip device that is wirelessly powered by radio frequency (RF) transmissions and modulated light in accordance with an exemplary embodiment.

Microfluidics presents a useful and versatile technology platform to use interactions of objects in the fluid with other physical mechanisms such as optical, acoustic, magnetic, and electrical fields for various sample sensing, diagnostic, processing, manipulation and other operations and functionalities. Fluorescence, scatterings, surface plasmonics, and surface enhanced Raman scattering are examples of optical bio- and chemical-detection in microfluidic environment. These methods can reveal important information about the properties of the species under test. Acoustic and electromagnetic fields can interact with the species of proper densities and magnetic properties remotely, producing useful functions such as sample sorting and separation. Moreover, the interaction between the suspended objects and the applied electric field can be identified and described. Besides using electrical current to heat the sample in miniaturized polymerase chain reaction (PCR) systems, a suspended object can interact with the electric field in various manners, including, for example, electrophoresis effect (EP), direct current-dielectrophoresis effect (DC-DEP), and alternating current-dielectrophoresis (AC-DEP) effect.

In particular, DEP is the force exerted on dielectric particles in a non-uniform electrical field and can be characterized as:

$$F_{DEP} = 2\pi \in_m a^3 K_{cm}(\in, \sigma, \omega) \nabla |E|^2 \quad (1).$$

In Equation (1), $K_{CM}$ is the Clausius-Mossotti factor and is a function of permittivity, $\in$, conductivity, $\sigma$, and frequency, $\omega$, of the E-field. $\nabla$ is the gradient operator that is applied to the electric field, a is the radius of the particle and $\in_m$ is the permittivity of the suspending medium. Microfluidic devices based on the DEP effect are widely used for cell separation, trapping, positioning and transportation because of the advantages of fast speed, single cell manipulation capability, and low cost. However, since the DEP force is frequency dependent, as shown in the Clausius-Mossotti factor, $K_{CM}$, in Equation (1), signals with different frequencies may need to be used to control the behavior of different particles within the same microfluidic device. Hence it is common that DEP-based microfluidic devices require several connecting wires between the lab-on-a-chip device and external instruments, such as power supplies, waveform and function generators, etc. However, such external electrical components can increase the cost and size of the microfluidic devices. Moreover, setting and adjusting the amplitudes, frequencies, and phases of the signals using the external components can add complexities of operation, which can increase the chances of error, especially when carried out by pathologists and clinicians whom may not be the best trained personnel to operate power sources, waveform generators, and the like.

The methods, apparatus and systems of the disclosed embodiments facilitate the operations of a lab-on-a-chip device, and more particularly, provide DC and AC signals that produced on the lab-on-a-chip device in a wireless fashion. The DC and AC signals can in turn control the behavior of particles and biological samples in the microfluidic channels that are incorporated into the lab-on-a-chip device. The disclosed lab-on-a-chip devices can, at minimum, save the clinicians the extra work of (a) attaching electrical wires to the sample slide and (b) operating multiple electrical instruments when they work under the microscope. For example, the disclosed lab-on-a-chip devices can provide a wireless solution for the above two issues. Both DC signals and AC signals of various frequencies and waveforms can be generated wirelessly using, for example, modulated light emitting diodes (LEDs) impinging upon an O/E (optical-to-electrical) circuits attached to or integrated with the lab-on-a-chip device. Alternatively, or additionally, the DC signals can also be generated from radio frequency (RF) electromagnetic irradiation that is coupled to RF circuit attached to the lab-on-a-chip device. In some example embodiments, the RF power is produced using off-the-shelf RF transmitters such as RFID readers. While the DC power can be wirelessly transmitted to the lab-on-a-chip device using optical or RF sources, the needed AC signals and special signal waveforms are generated by modulated external light sources (such as LEDs) since one can readily modify or program the modulation format and waveforms of the light sources and transmit the modulated light to the lab-on-a-chip device for use by integrated optical switches or photovoltaic devices. Thus, the systems and methods of the disclosed embodiments can eliminate all wire connections to the lab-on-a-chip device and greatly simplify the device operation. The results can include superior performance, higher throughput, reduced probability of operation errors, and simple operation.

In some embodiments, photoconductive devices, photovoltaic devices and/or RF circuits are used to generate and/or control the supply of DC and AC signals on the lab-on-a-chip device. Certain aspects of the disclosed embodiments relate to the supply of power to a lab-on-a-chip system in a wireless fashion. Other aspects of the disclosed embodiments enable the generation of controlled electrical waveforms (e.g., AC voltages and currents at one or frequencies).

In some embodiments, an RF transmitter and an optical source collaboratively provide the DC and AC signals that are needed for the operation of the lab-on-a-chip system. For example, an RF transmitter can be used to inductively couple the RF power to an RF circuit with a rectifier to convert the RF power into a DC output to the lab-on-a-chip device. At the same time, a light source, such as a light emitting diode (LED), can be modulated and used to provide an optical signal to one or more switches that are integrated as part of the lab-on-a-chip system. The optical switches can be optically controlled to provide, for example, an on-off switching capability, and to thereby convert the DC signal into one or more AC signals, as needed. As a result, in embodiments that utilize a "hybrid design," two types of wireless external sources, namely an RF source and a light source, can be wirelessly coupled to the lab-on-a-chip device to generate both the DC and the AC signals with desired characteristics.

In some embodiments, only optical sources are used to produce the DC and the AC signals at the lab-on-a-chip device. For example, an LED source can be used to generate the DC signal(s) by irradiating an optoelectronic component (e.g., a photovoltaic component) that is incorporated into lab-on-a-chip device. The produced DC signal can then be input to another optoelectronic component (e.g., a photoconductor or a photoconductive component) within the lab-on-a-chip device that is controlled by a modulated light source to produce the AC signals with desired characteristics.

FIG. 1 illustrates a lab-on-a-chip device 102 that is wirelessly powered by RF transmissions and modulated light 112 in accordance with an exemplary embodiment. In the exemplary hybrid design of FIG. 1, the RF transmitter 104 inductively couples power to an antenna 116 that is integrated into the lab-on-a-chip device 102. The RF transmitter 104 includes an oscillator at a specific frequency and an antenna 114 to irradiate a receiver circuit with RF energy. The amount of RF energy coupled to the receiver circuit depends on the antenna (inductor) designs of both the receiver and the transmitter, the power of the transmitter, and the distance between the transmitter and the receiver. Since 13.56 MHz is a frequency that is approved by the Federal Communications Commission (FCC) for use in radio frequency identification (RFID) systems, in some embodiments, the RF transmitter 104 is an RFID transmitter that operates at 13.56 MHz. This approach fully leverages the extensive investment in RFID industry. The antenna 116 on the receiver (i.e., on the lab-on-a-chip device 102) can comprise a spiral inductor. The number of turns, the area enclosed by the inductor, and the resistance of the metal wires determine the power coupling efficiency and the Ohmic loss. The AC power coupled into the antenna 116 produces an AC voltage signal at the same frequency as the input RF signal from the transmitter 104. The inductively coupled AC signal is subsequently input to the rectifier 106. The rectifier 106 can, for example, include diodes and capacitors that convert the input AC signal to a DC signal that is used by the lab-on-a-chip device 102, as well as other integrated circuitry 118 which may be part of the lab-on-a-chip device 102. The integrated circuitry 118 can include a number of resistive, capacitive and inductive components, as well as transistors, registers, switches, memory devices, processors and other analog and digital circuitry. The DC signal produced at the output of the rectifier 106 can also be used by the microfluidic chip 110 (e.g., for biasing the integrated electrodes within the microfluidic chip 110 at one or more voltage levels).

Referring back to FIG. 1, the on-chip photoconductive component(s) 108 can operate as a photo sensitive switch that is remotely controlled by a modulated light 112 from an external light source. The external light source can, for example, comprise an LED or a semiconductor laser diode. In some example embodiments, the external light source is intensity modulated up to tens of megahertz. In response to receiving the modulated light 112, the photoconductive component(s) 108 can modulates the input DC signal to produce an AC signal with a waveform that is similar to that of the modulated light 112. For example, the photoconductive component(s) 108 modulate the DC signal as an on-off switch. Such that the produced AC signal has a peak amplitude equal to the DC input signal and the same frequency as the modulated light 112. Benefited from the ease of modulation of external light sources, the on-chip AC signal generator that is described in connection with FIG. 1 can produce flexible AC signals for use of the microfluidic chip 110. For example, signals at a particular frequency can be generated over a specific time period to control the behavior of the bioparticles in the microfluidic device. In some embodiments, signals containing two or more frequency components can be generated at the same time to control the properties of multiple bioparticles (e.g. different cell types or biomolecules).

The information from the microfluidic chip 110 can be wirelessly transmitted to an outside receiving device. In some example embodiments, the data from the microfluidic chip 110 may be processed or conditioned by the integrated circuitry 118 such that it can be provided to the antenna 116 and subsequently transmitted to an outside entity. The information communicated with entities outside of the lab-on-a-chip device 102 can further include handshaking and protocol information. In such a design, the circuitry and antenna 116 on the lab-on-a-chip device 102 operate as a transponder, and the RF reader/transmitter 104 outside of the lab-on-a-chip device 102 operates as a transceiver. In some embodiments, particular data or control signals from an external entity (e.g., a laptop, a wireless device, etc.) may also be transmitted to the lab-on-a-chip device 102 of FIG. 1 using the RF transmitter 104.

It should be noted that an RFID transmitter can typically transmit only a very limited amount of power (in the order of milliwatts to microwatts) to a receiving circuit in the vicinity of the transmitter, thus limiting the amount of operations that the receiving circuit can perform. However, this power limitation imposes less of a constraint to the applications of the microfluidic devices that control bioparticles since the amount of required power is significantly lower than that in other applications. Fundamentally, the DC or AC current in microfluidics is carried by ions, molecules, and cells. Since the mobility of these charge carriers is several orders of magnitude lower than that of electrons in a semiconductor, the peak current level associated with these charge carriers may be in the order of nano amperes. As a result, the power consumption for cell sorting, separation, or lysis could be no more than microwatts. Due to the low power consumption, fluidic medium will suffer from minimum temperature rise, which is critical to bio-detection involving proteins and cells.

As noted in connection with FIG. 1, remote control can be achieved, at least in-part, using an integrated photoconductor device that functions as an optically controlled switch. To this end, the impedance of the photoconductor device can vary by orders of magnitude based on the intensity of light that is incident upon the photoconductor device. For example, the photoconductor device can become a conductor when illuminated by light at a particular wavelength and become an insulator in darkness, or when illuminated by light of a different frequency. Photoconductive switches can be implemented using various semiconductors or polymers. The optimal choice of photoconductive switch depends on factors such as available light sources, response time or frequency, process complexity, and cost.

Figure 2:
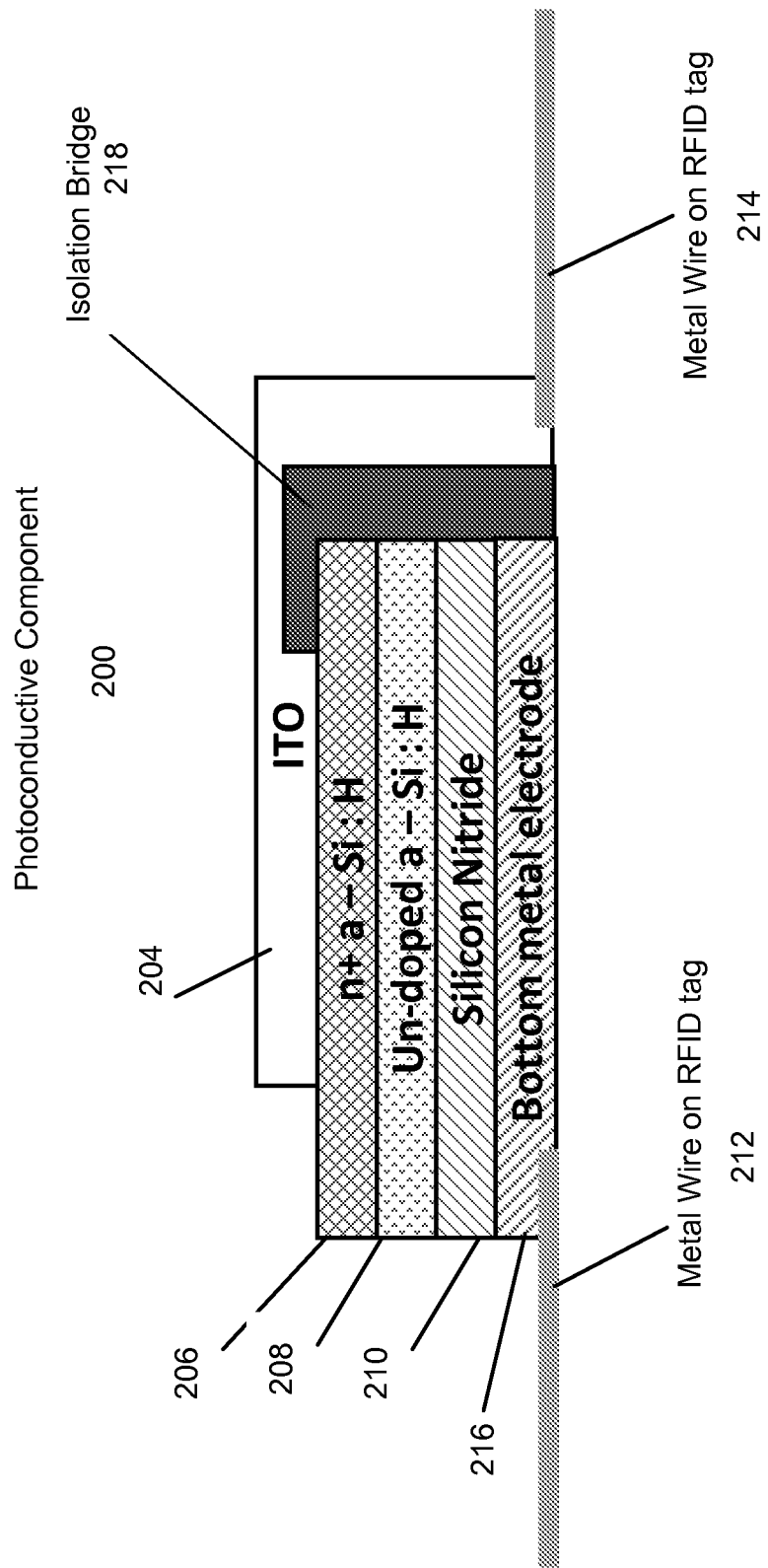
FIG. 2 illustrates a structure of a photoconductive component in accordance with an exemplary embodiment.

In some example embodiments, hydrogenated amorphous silicon (a-Si:H) is used as the photoconductive material for use in the photoconductive components of the disclosed embodiments. Intrinsic a-Si:H has a shorter carrier diffusion length and higher optical absorption coefficient than crystalline silicon, making it a good photosensitive material. Another layer of heavily doped a-Si:H thin film may be formed in tandem with the intrinsic a-Si:H to lower the contact resistance. FIG. 2 illustrates a structure of a photoconductive component 200 in accordance with an exemplary embodiment. The photoconductive component 200 can operate as a switch when illuminated by a modulated light. The photoconductive undoped a-Si:H layer 208 may be sandwiched by a heavily doped n+ a-Si:H layer 206 and a silicon nitride (or silicon oxide) layer 210 for superior electrical performance. The heavily doped n+ a-Si:H layer 206 facilitates transport of photo-excited carriers, and the silicon nitride (or silicon oxide) layer 210 acts as an insulating layer and a blocking capacitor to remove DC level shift. All layers can be fabricated using chemical vapor deposition techniques, such as plasma-enhanced chemical vapor deposition (PECVD) and hot-wire chemical vapor deposition (HWCVD). The photo sensitive layer/stack can include a bottom metal electrode 216 and a top indium-tin oxide (ITO) transparent electrode 204 that is isolated from the undoped a-Si:H layer 208, the silicon nitride (or silicon oxide) layer 210 and the bottom metal electrode 216 using an isolation bridge 218. The metal wires 212 and 214 provide the AC output signal of the photoconductive component 200.

Figure 3:
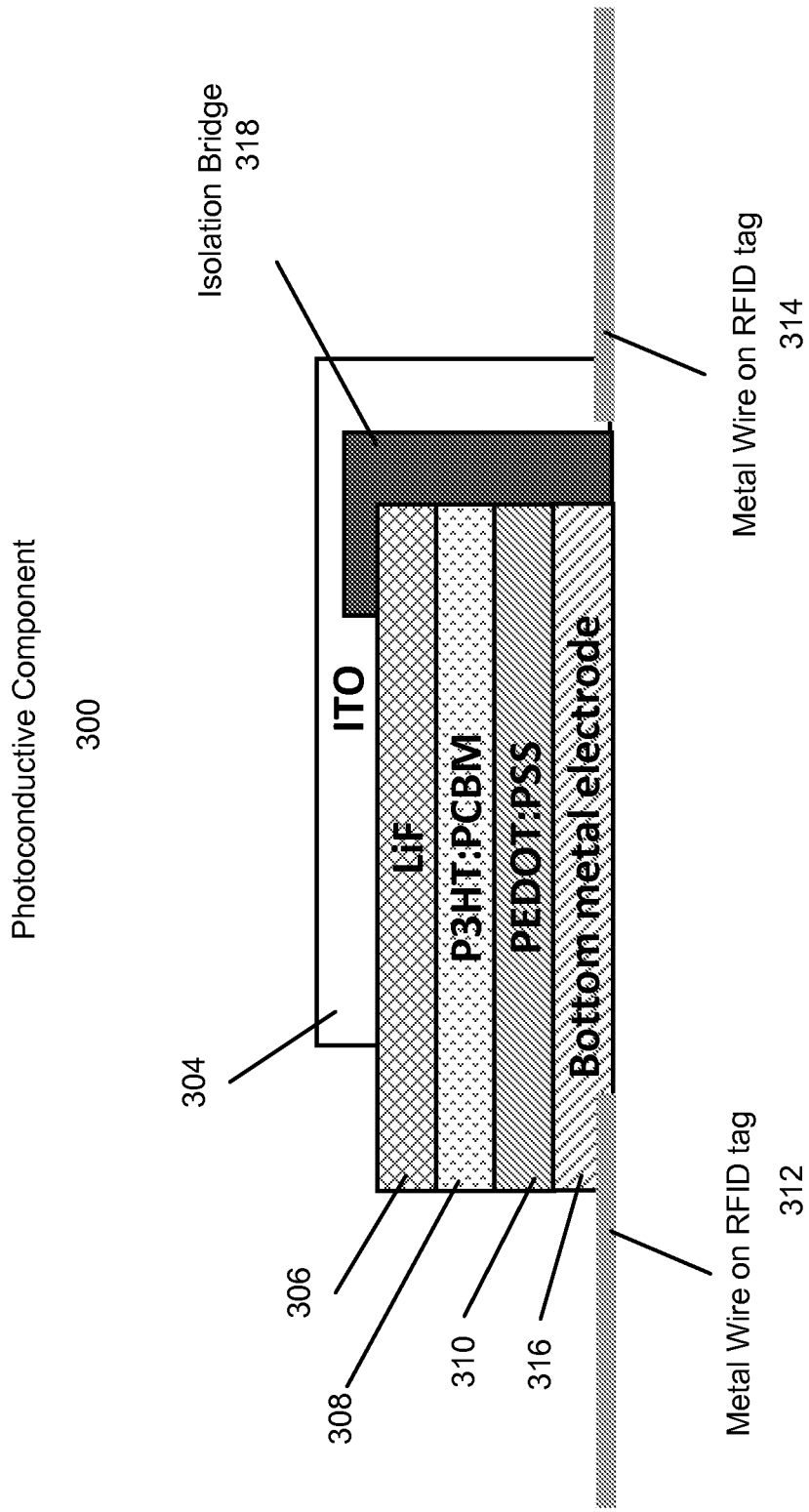
FIG. 3 illustrates a structure of a photoconductive component in accordance with another exemplary embodiment.

In some example embodiments, other structures comprising semiconductor or polymers include single-crystalline bipolar junction transistor (BJT), bulk-heterojunction (BHJ) polymer, dye-sensitized solar cells (DSSC), and the like. FIG. 3 illustrates a structure of a photoconductive component 300 in accordance with an exemplary embodiment. The photoconductive component 300 can operate as a switch when illuminated by a modulated light. The photoconductive switch 300 of FIG. 3 consists of a thin film of BHJ polymer layer 308, which is a mixture of regioregular poly(3-hexylthiophene) (P3HT) and [6,6]-phenyl C61-butyric acid methyl ester (PCBM). The P3HT:PCBM thin film can, for example, be spin-coated at a relatively low temperature, which improves process compatibility. The photoconductive switch 300 of FIG. 3 further includes a lithium fluoride (LiF) layer 306, which serves as a protection layer to prevent exposure of the polymer to water and oxygen, and to extend the life span and reliability of the photoconductive component 300. When excited by a modulated light, photo-induced charge carriers are created by the transfer of excitons at the donor/acceptor interface in the BHJ polymer layer 308. The photoconductive component 300 also includes a conductive poly(3,4-ethylenedioxythiophene): poly(styrenesulfonate) (PEDOT:PSS) layer 310 that may be used as an interfacial buffer layer to smoothen the roughness of bottom metal electrode 316. A top indium-tin oxide (ITO) transparent electrode 304 provides electrical connectivity for attachment of the photoconductive component 300 to the metal wire 314 on the RFID tag. top indium-tin oxide (ITO) transparent electrode 304 is isolated from the BHJ polymer layer 308, the PEDOT:PSS layer 310 and the bottom metal electrode 316 using an isolation bridge 318. The metal wires 312 and 314 provide the AC output signal of the photoconductive component 200. It is also feasible to fabricate the photoconductive switch over a large-area or on flexible polymer substrates through continuous roll-to-roll coating process. In addition, various conjugated polymers with different bandgap structures can be fine-tuned, if necessary, by replacing the P3HT with PCBM as the photoconductive layer to alter the spectral response of each photoconductive component.

In connection with the photoconductive devices of the disclosed embodiments, the bandgap of the photosensitive material defines the excitation wavelength that can be used to generate the AC/DC signals for the lab-on-a-chip device. In addition, multiple light sources at the same or different wavelengths can be used to illuminate different photoconductors to generate several AC outputs at different frequencies. The resistance of the photoconductor is determined by the material properties (e.g. mobility of electrons and holes) and device geometry. Besides photoconductivity, photo responsivity, the ease of fabrication, material stability and reliability, and cost are also considered when designing the photoconductive components in accordance with the disclosed embodiments.

In some exemplary embodiments, a photovoltaic device is used to facilitate the generation of DC and/or AC signals. A photovoltaic device converts light into electricity via a heterojunction or a p/n junction. Some of the photovoltaic materials suitable for the lab-on-a-chip technology include amorphous silicon, crystalline silicon, cadmium telluride, copper indium selenide/sulfide, and the like. To generate DC power, light of substantially constant intensity illuminates the active area of the photovoltaic device. To generate AC power, intensity modulated light from a light source (e.g., an LED or laser source) illuminates the photovoltaic device. In this manner, the electrical signal produced by the photovoltaic device has a similar waveform as the intensity modulated light incident upon the photovoltaic device. For example, the photovoltaic device can be used to generate sinusoidal waveforms, approximately rectangular pulses, triangle waveforms, and the like, corresponding to one or more frequencies. In some embodiments, two or more photovoltaic devices can be connected in series to produce the desired voltage amplitude. Additionally, or alternatively, two or more devices can be connected in parallel to increase the current output by the combination of photovoltaic devices.

Figure 4:
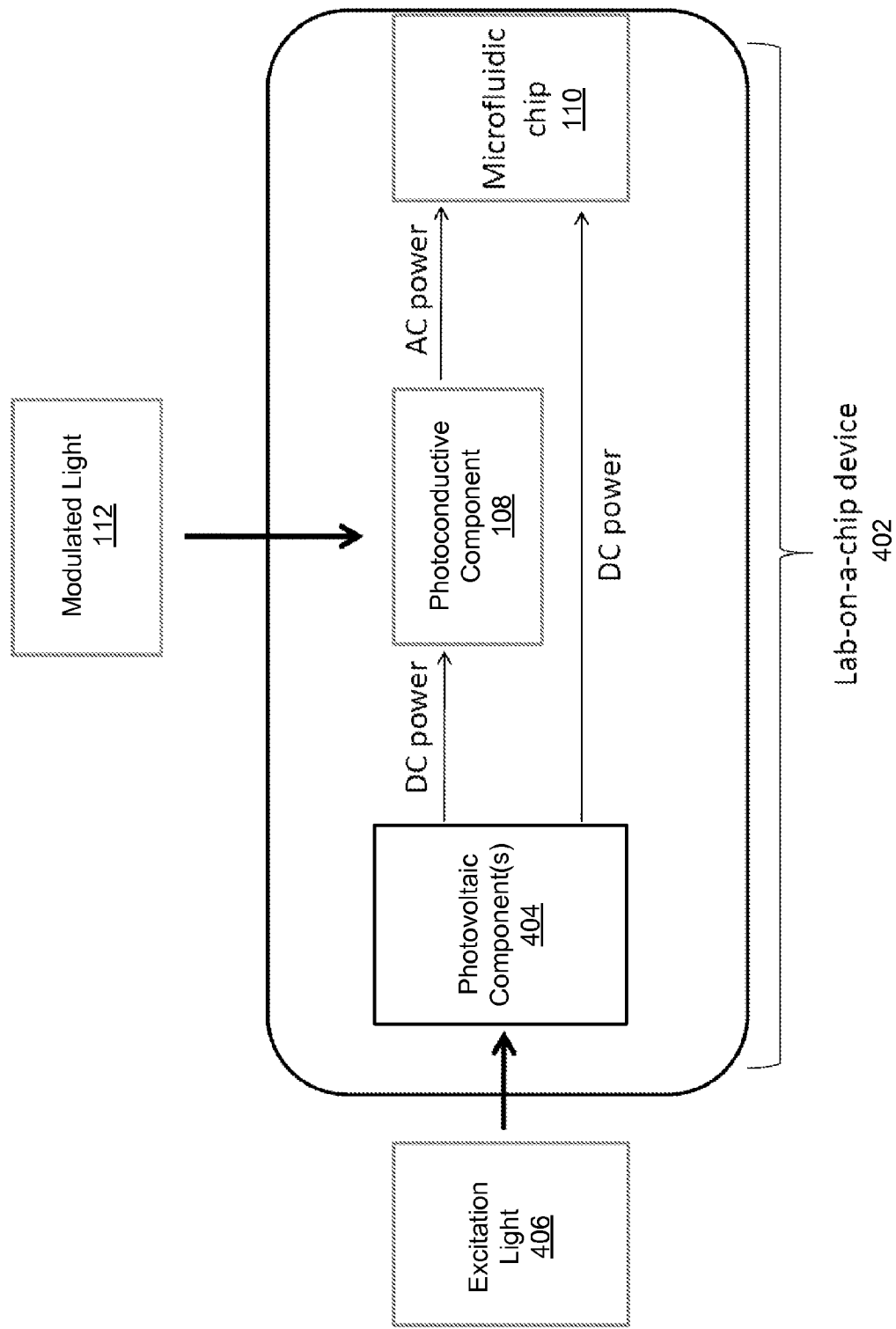
FIG. 4 illustrates a lab-on-a-chip device that is wirelessly powered by one or more light sources in accordance with an exemplary embodiment.

FIG. 4 illustrates a lab-on-a-chip device 402 that is wirelessly powered by one or more light sources in accordance with an exemplary embodiment. In particular, the lab-on-a-chip device 402 of FIG. 4 utilizes photoconductive component(s) 108 and photovoltaic component(s) 404 to generate the AC and DC signals, respectively. The excitation light 406 of substantially constant intensity is incident upon the photovoltaic component(s) 404 to generate the DC power that can be used by the microfluidic chip 110 and/or integrated circuits that may reside on the lab-on-a-chip device 402. The generated DC signal can also be utilized by the photoconductive component(s) 108 to generate AC signals in response to a modulated light 112, as previously discussed in connection with FIG. 1. The excitation light 406 can have a broad and/or narrow range of spectral contents, and may be adjusted and/or selected based on the spectral response of the photovoltaic component(s) 404 and the desired DC and AC signal values. The source of excitation light can be an external LED or laser.

Figure 5:
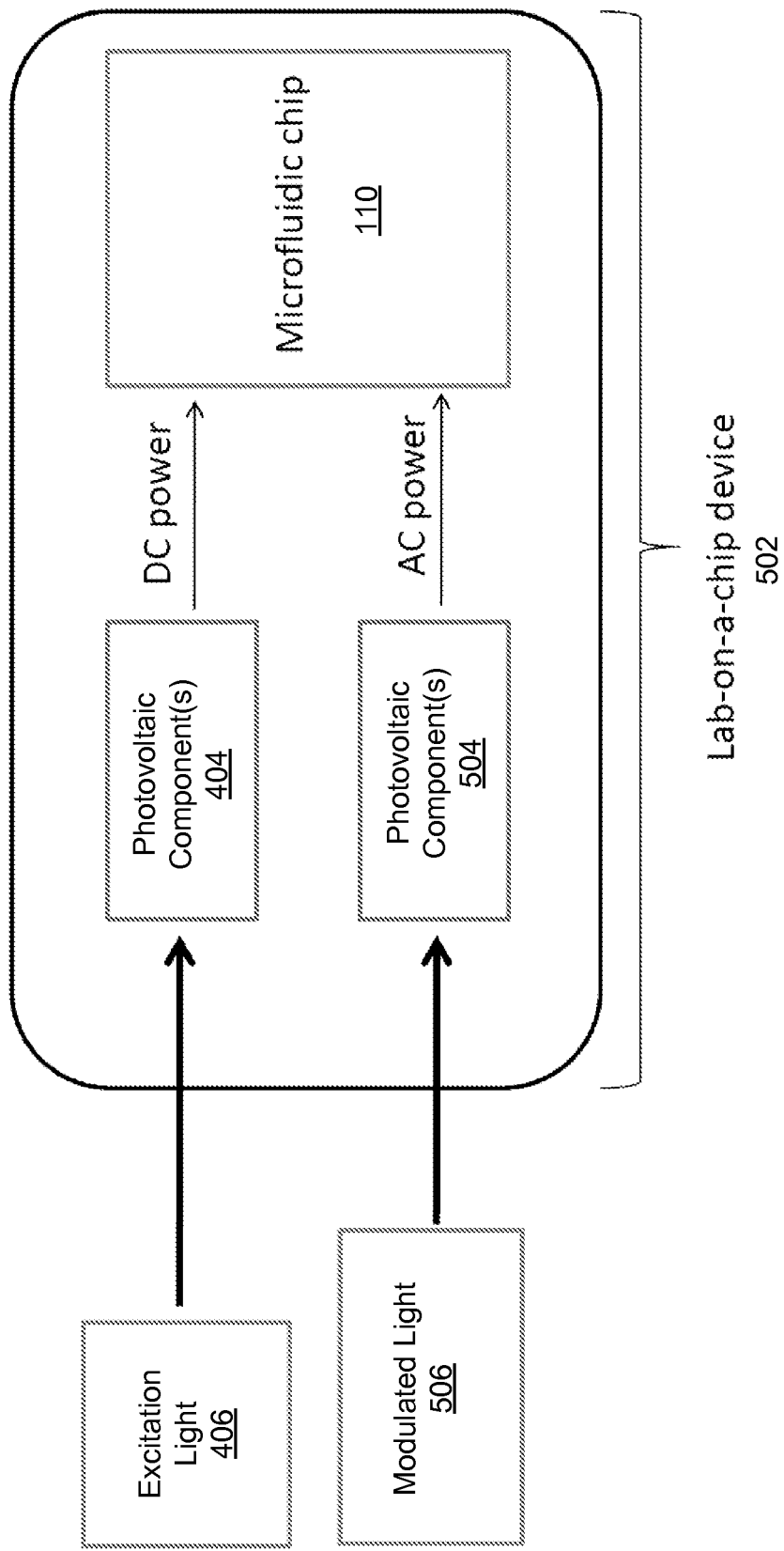
FIG. 5 illustrates a lab-on-a-chip device that is wirelessly powered by one or more light sources in accordance with another exemplary embodiment.

FIG. 5 illustrates a lab-on-a-chip device 502 that is wirelessly powered by one or more light sources in accordance with another exemplary embodiment. The excitation light 406 is incident upon a first set of one or more photovoltaic component(s) 404 to generate the DC power in a similar manner that was discussed in connection with FIG. 4. The modulated light 506 is incident upon a second set of one or more photovoltaic component(s) 504 to produce the output AC signal(s), with a waveform similar to that of the modulated light 506. The microfluidic chip 110 and integrated circuitry that may reside on the lab-on-a-chip device 502 are powered using the DC and/or AC signals generated by the first and second photovoltaic devices 404 and 504, respectively. The exemplary architecture of the lab-on-a-chip device 502 of FIG. 5 illustrates an on-chip electrical signal generator that can be powered and controlled solely by the photovoltaic component(s) 404 and 504.

It should be noted that the lab-on-a-chip devices 402 and 502 of FIGS. 4 and 5, respectively, can additionally include RF power reception/transmission components that are, for example, similar to those illustrated in FIG. 1. The RF components can be used to generated, at least in-part, the needed DC power for the consumption by various components on the lab-on-a-chip devices, as well as to receive data/control signals from an external RF transceiver and/or to transmit information/data back to the external RF transceiver.

Figure 6:
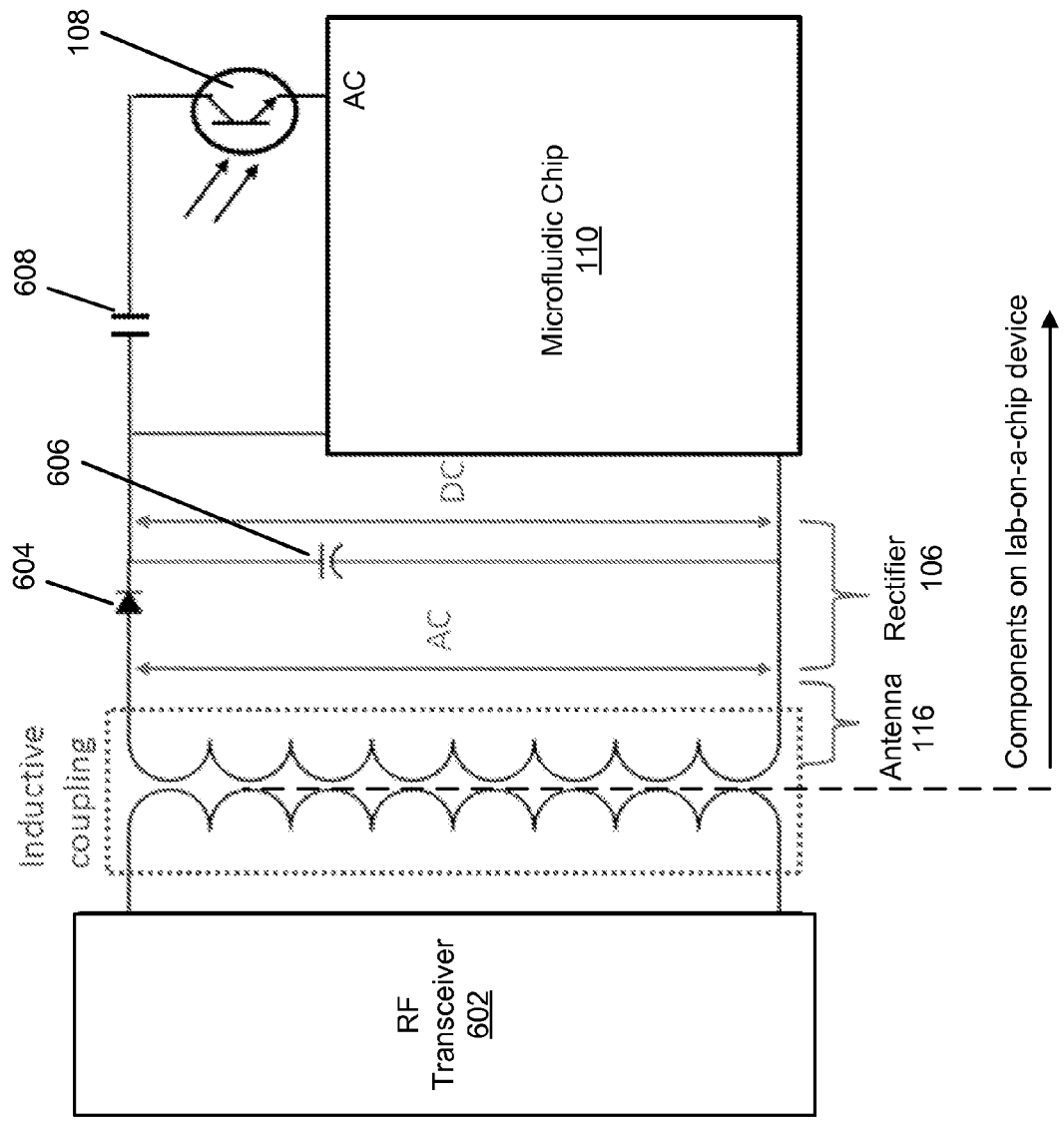
FIG. 6 illustrates a circuit diagram of an on-chip electrical signal generator in accordance with an exemplary embodiment.

FIG. 6 illustrates a circuit diagram of an on-chip electrical signal generator in accordance with an exemplary embodiment. An on-chip inductor/antenna 116 couples AC power from an RF transceiver 602. In one example embodiment, the RF transceiver 602 is an RFID transceiver that operates at the frequency 13.56 MHz. The coupled AC power is input to a rectifier 106 that includes at least one diode 604 and at least one capacitor 606 to produce a DC signal that can be supplied to the microfluidic device 110. The diode 604 blocks the negative voltage in the half-cycle of the AC waveform and the capacitor reduces the ripples of the output DC signal. The DC signal can be used to, for example, produce electrophoresis (EP) effect to drive the charged biomolecules such as proteins, DNAs, and/or functionized beads in the microfluidic device 110. To produce the AC signal, the DC output of the rectifier 106 is connected to a blocking capacitor 608 and then to a photoconductive component 108 that operates as an optical switch. The output of the photoconductive component 108 optical switch is an AC signal having its frequency determined by the modulating frequency of the external light source and the RC delay (i.e., a time contestant associated with resistive and capacitive elements of the lab-on-a-chip device). The circuitry that is illustrated in FIG. 6 can support multi-megahertz signals that can be used to produce a DEP effect to control the motions of cells and beads in the microfluidic device 110.

Figure 7:
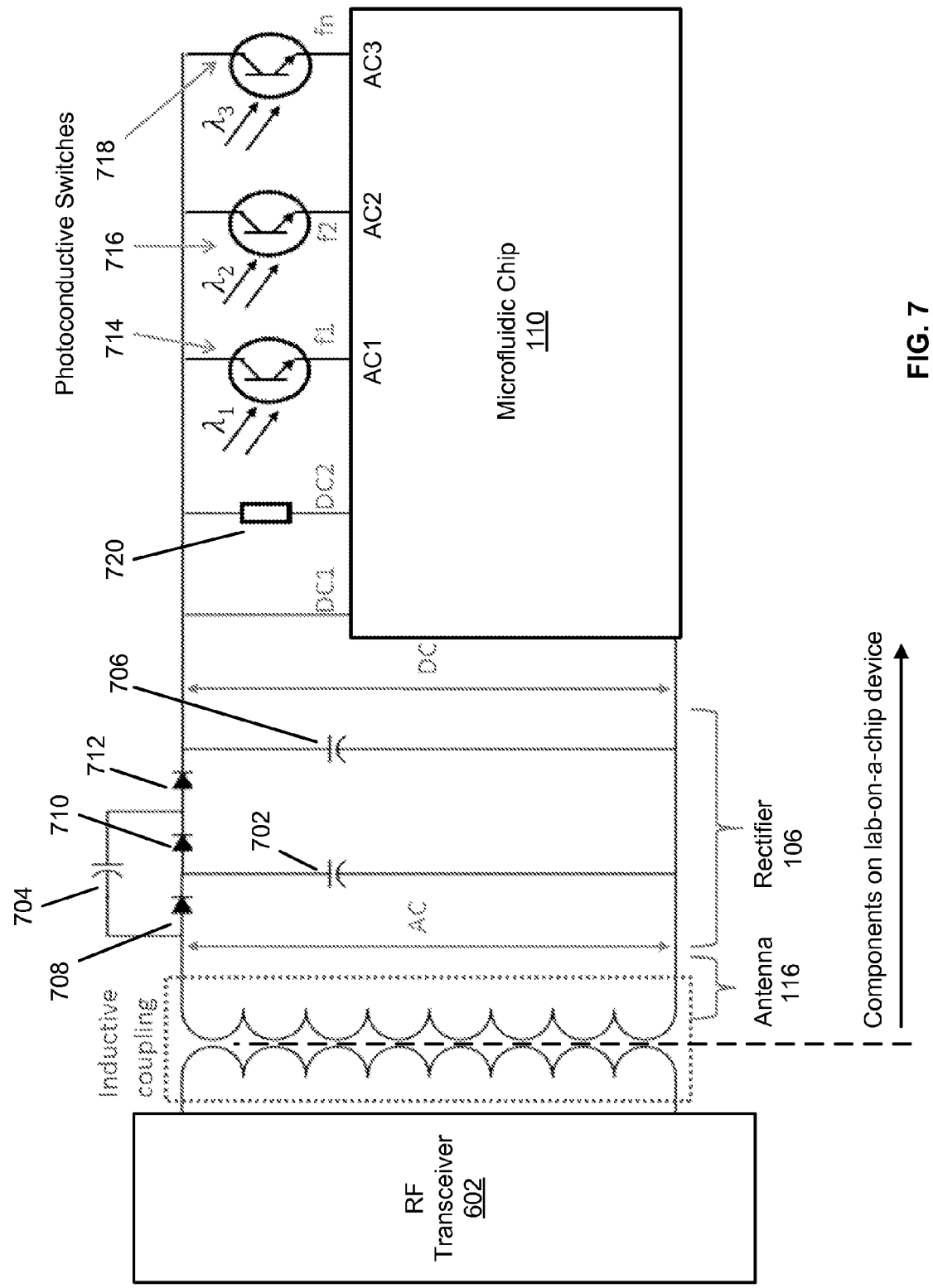
FIG. 7 illustrates a circuit diagram of an on-chip electrical signal generator in accordance with another exemplary embodiment.

FIG. 7 illustrates a circuit diagram of an on-chip electrical signal generator in accordance with an exemplary embodiment. The circuit that is illustrated in FIG. 7 can provide the microfluidic device 110 with DC signals and AC signals at multiple frequencies. An on-chip inductor/antenna 116 couples the AC power from an RF transceiver 602. In one example embodiment, the RF transceiver 602 is an RFID transceiver that operates at the frequency 13.56 MHz. The coupled AC power is input to a rectifier 106. The rectifier 106 includes a voltage tripler with three capacitors 702, 704 and 706, and three Schottky diodes 708, 710 and 712 to achieve the desired DC voltage level. Several photoconductive components 714, 716 and 718 with different bandgaps, or covered by different optical bandpass filters, are provided on chip to generate AC signals when modulated by light of different wavelengths (e.g., $\lambda_1$, $\lambda_2$, $\lambda_3$, etc.). Such an on-chip electrical signal generator is capable of simultaneously producing multiple outputs at different frequencies (e.g., $f_1$, $f_2$, $f_n$, etc.) and waveforms, which increases the functionality, performance, and throughput of the microfluidic device 110. One or more DC signals (e.g. DC1, DC2, etc.) can be supplied from the rectifier 106 to the microfluidic device 110, as well as other analog and digital circuitry that may reside on the lab-on-a-chip device. For example, the DC2 signal may be produced from the DC1 signal using a resistive component 720.

Figure 8:
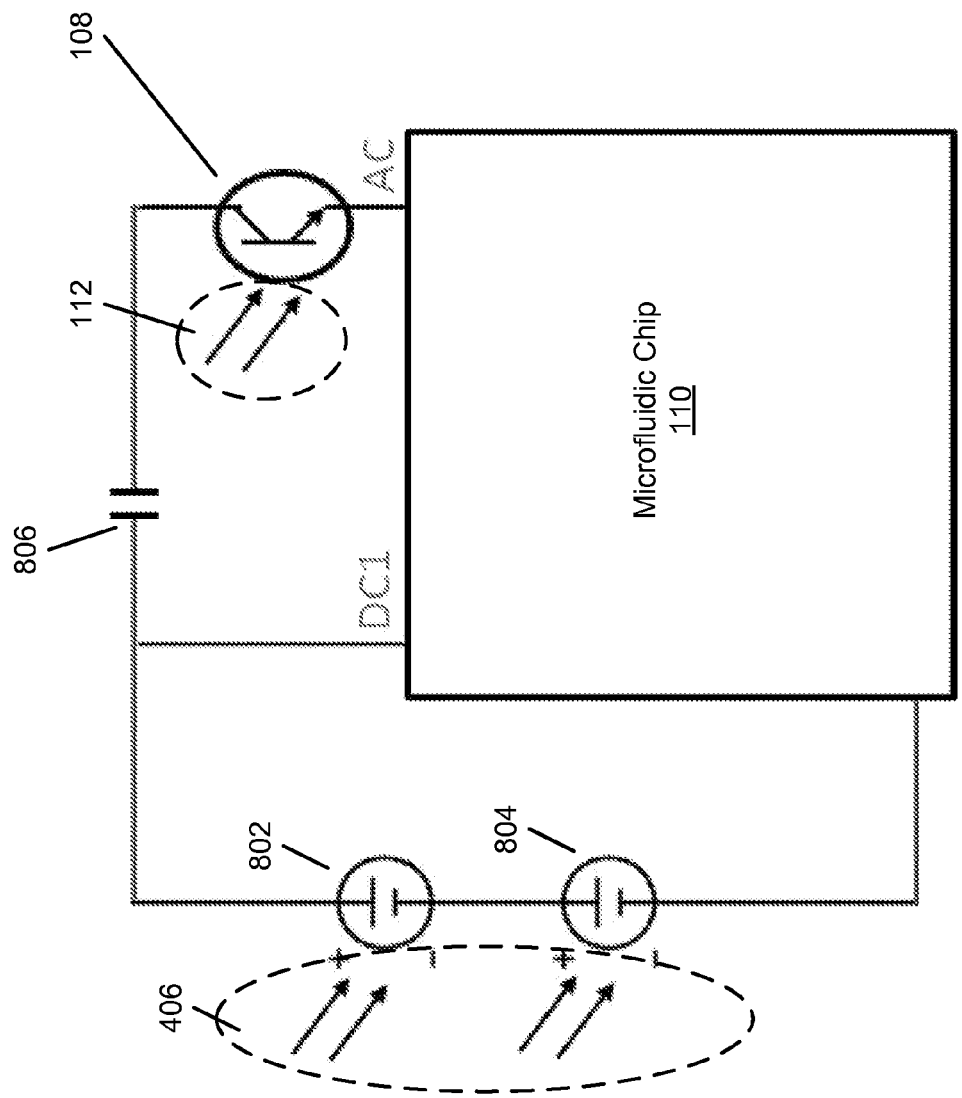
FIG. 8 illustrates a circuit diagram of an on-chip electrical signal generator in accordance with another exemplary embodiment.

FIG. 8 illustrates a circuit diagram of an on-chip electrical signal generator in accordance with another exemplary embodiment. The signal generator includes one or more photovoltaic components 802 and 804, and at least one photoconductive component 108. The DC power for the microfluidic device 110 is provided by the excitation light 406 (e.g., a constant intensity radiation) that is incident upon the photovoltaic components 802 and 804. Several photovoltaic components can be used in series (as shown in FIG. 8) to produce larger voltages and electrical power, if needed. The AC power is produced using the modulated light 112 that can turn the photoconductive component 108 on and off, thereby converting the DC signal into an AC signal with desired frequency. A blocking capacitor 806 can be used to decouple the AC signal.

Figure 9:
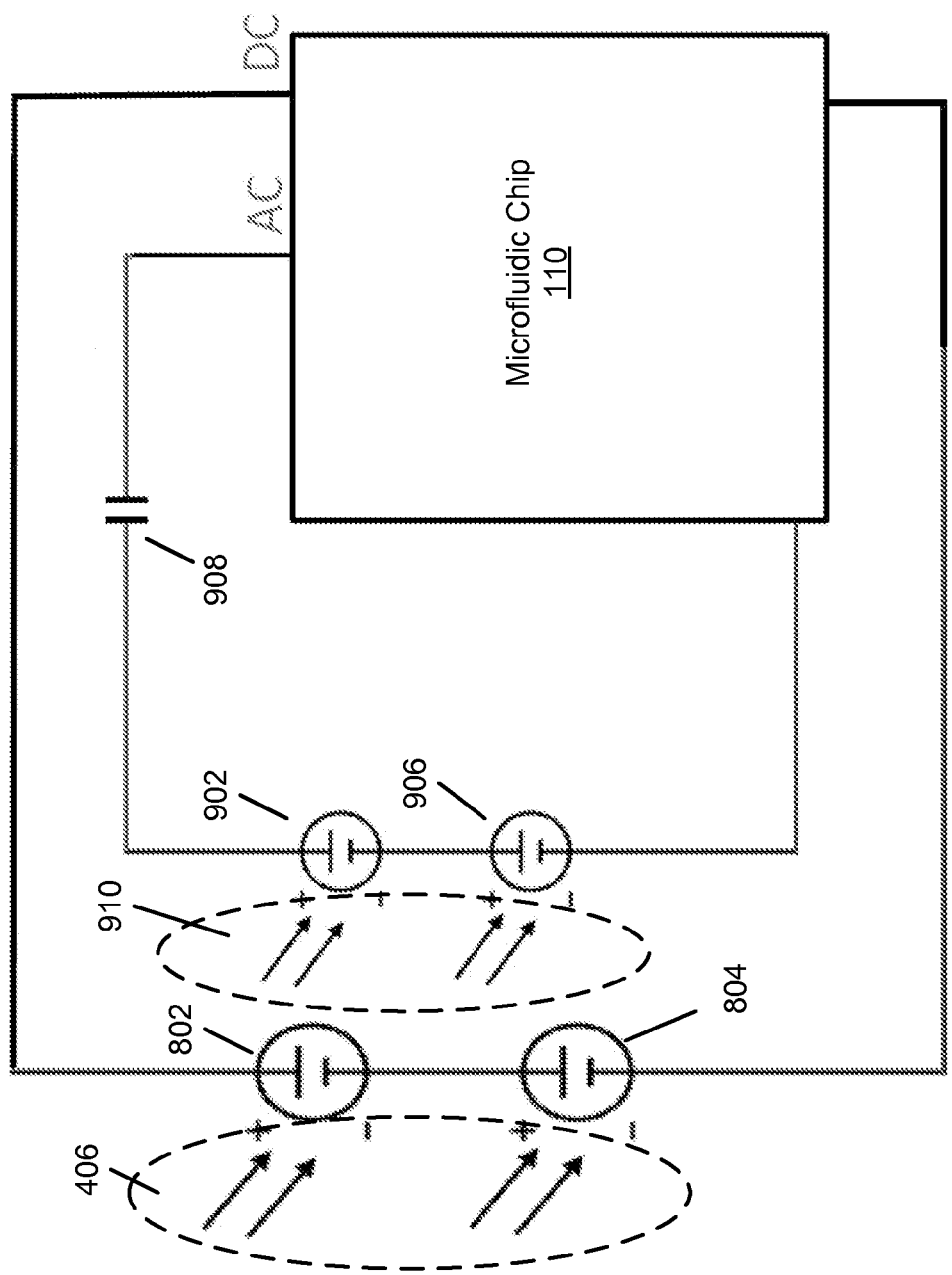
FIG. 9 illustrates a circuit diagram of an on-chip electrical signal generator in accordance with another exemplary embodiment.

FIG. 9 illustrates a circuit diagram of an on-chip electrical signal generator in accordance with another exemplary embodiment. The exemplary diagram of FIG. 9 includes one or more photovoltaic components 802 and 804 that, similar to the configuration of FIG. 8, produce the DC signal when illuminated by excitation light 406 of, for example, constant intensity. One or more additional photovoltaic components 902 and 904 may be additionally used to generate the AC signal from the modulated light 910 that is incident upon these additional photovoltaic components 902 and 904. A blocking capacitor 908 can be used to decouple the AC signal.

The integrated circuits of the lab-on-a-chip devices of the disclosed embodiments can be made by either traditional integrated circuit processes or printing techniques. Using conventional single-crystal integrated circuit process or polycrystalline silicon process, both wireless power generation components (e.g., antenna and rectifier) and wireless control components (e.g., optical switch) can be made together. On the other hand, printing techniques can print circuitry on glasses, polymers and plastics, which is compatible with most of microfluidic devices. Compared to single crystal or polycrystalline silicon integrated circuit process, one particularly attractive feature of printed circuit is low cost and high throughput. Generally, a printed 96-bit RFID tag costs a few U.S. cents, which is expected to be reduced to about 1 U.S. cent using techniques such as roll-to-roll printing. Low cost printed integrated circuits make disposable microfluidic devices economically viable. The photoconductor can be patterned in different ways depending on the material properties. For example, hydrogenated amorphous silicon thin film can be patterned on printed circuits by chemical vapor deposition, such as plasma-enhanced chemical vapor deposition (PECVD) and hot-wire chemical vapor deposition (HWCVD), and the like.

Figure 10:
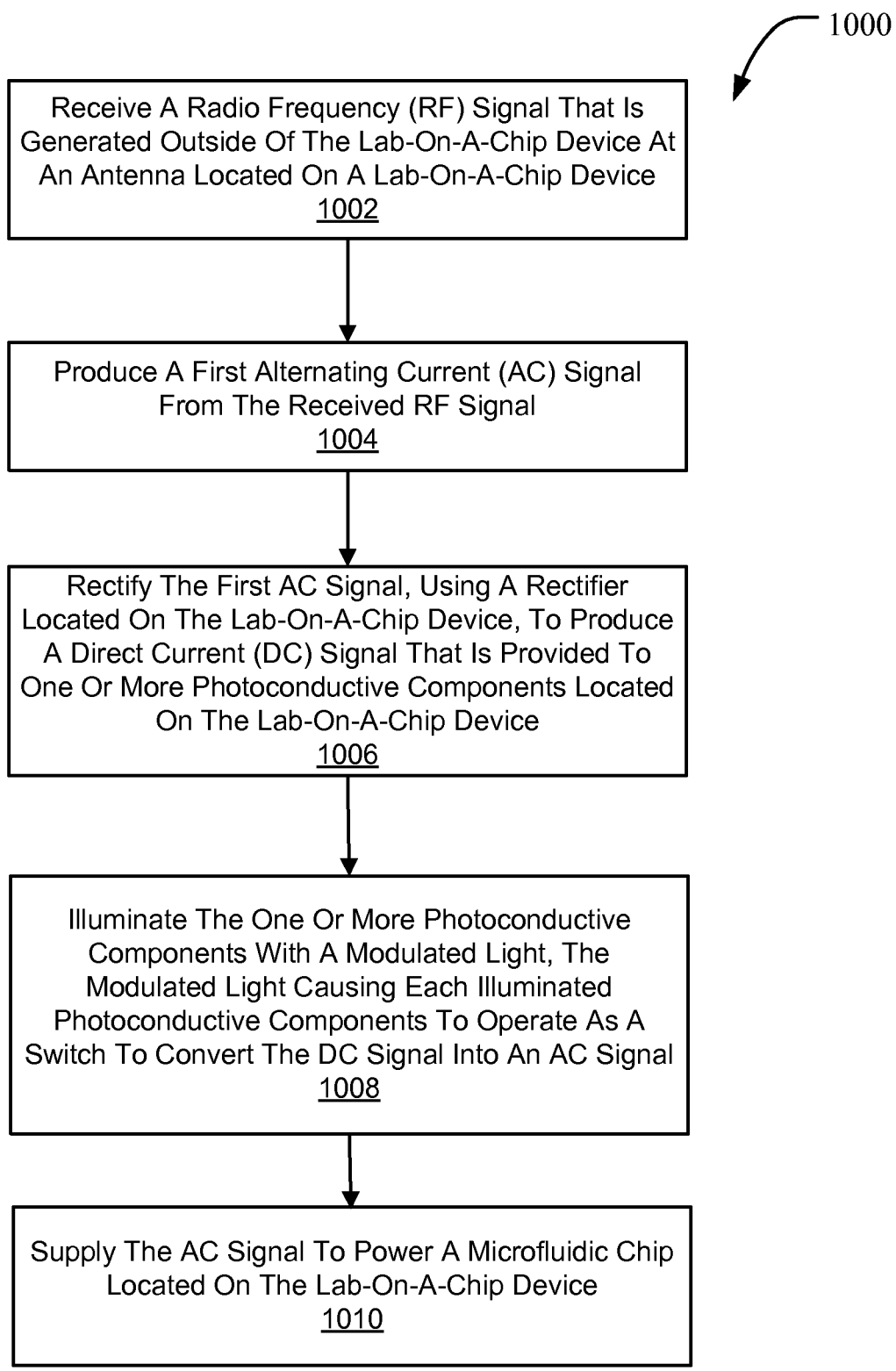
FIG. 10 illustrates a process for generating power on a lab-on-a-chip device in accordance with an exemplary embodiment.

FIG. 10 illustrates a process 1000 for generating power on a lab-on-a-chip device in accordance with an exemplary embodiment. At 1002, an RF signal that is generated outside of the lab-on-a-chip device is received at an antenna located on the lab-on-a-chip device. At 1004, a first AC signal is produced from the received RF signal. For example, the AC signal is produced via inductive coupling. At 1006, the first AC signal is rectified using a rectifier that is located on the lab-on-a-chip device. The rectifier produces an output direct current (DC) signal that is provided to one or more photoconductive components on the lab-on-a-chip device. At 1008, the one or more photoconductive components are illuminated with a modulated light. The modulated light causes each illuminated photoconductive component to convert the DC signal into an AC signal. For example, the conversion to the AC signal can be effected when the illuminated photoconductive component operates as an on-off switch in response to the receiving an intensity modulated light. At 1010, a microfluidic device that is located on the lab-on-a-chip device is supplied with the AC signal. The process 1000 that is illustrated in FIG. 10 enables the generation of power at the lab-on-a-chip device using RF components and photoconductive components that reside on the lab-on-a-chip device and are responsive to an RF signal and light from an external source.

Figure 11:
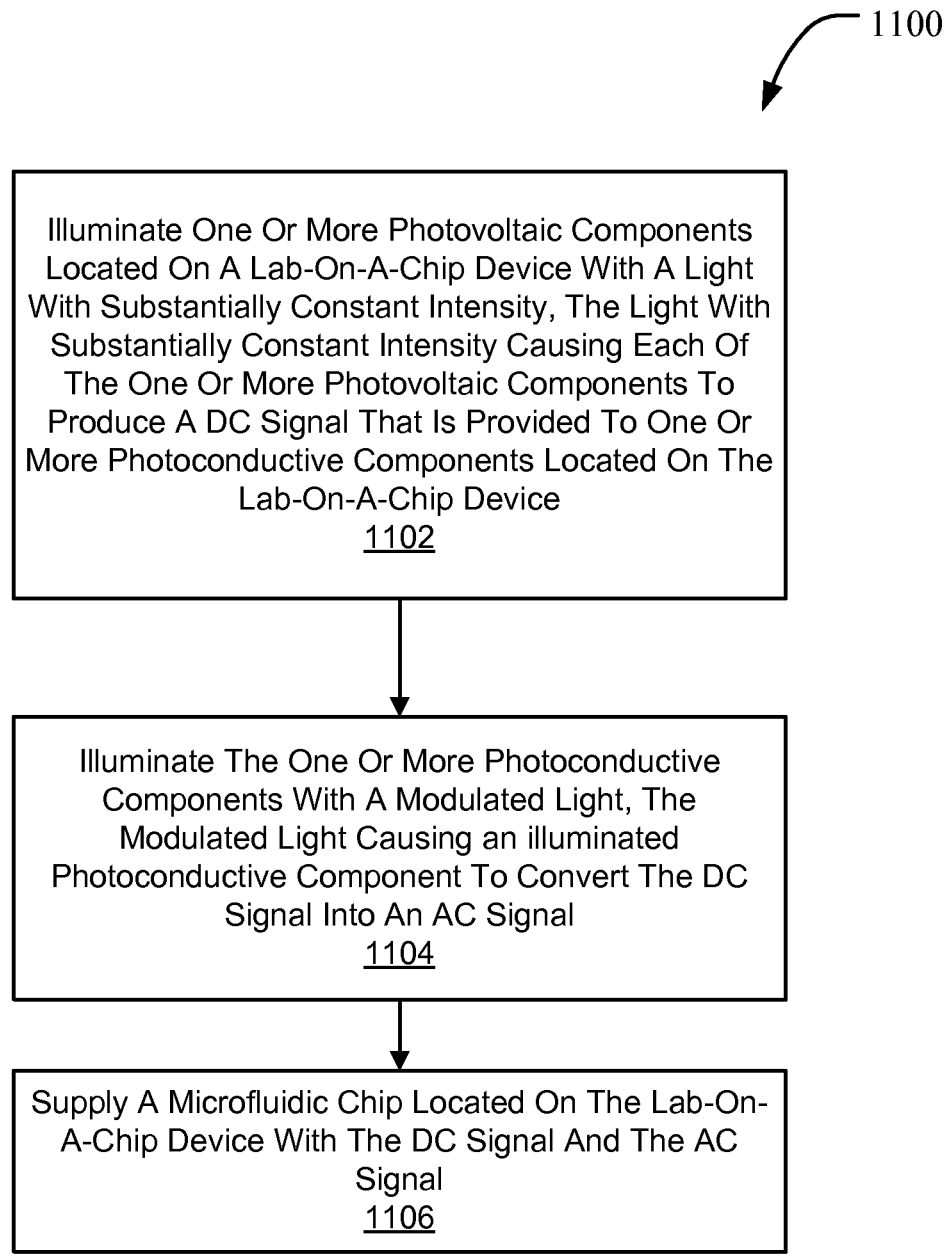
FIG. 11 illustrates a process for generating power on a lab-on-a-chip device in accordance with another exemplary embodiment.

FIG. 11 illustrates a process 1100 for generating power on a lab-on-a-chip device in accordance with another exemplary embodiment. At 1102, one or more photovoltaic components located on a lab-on-a-chip device are illuminated with a light with substantially constant intensity. The light with substantially constant intensity causes each of the one or more photovoltaic components to produce a DC signal that is provided to one or more photoconductive components located on the lab-on-a-chip device. At 1104, the one or more photoconductive components are illuminated with a modulated light. The modulated light causes an illuminated photoconductive component to convert the DC signal into an AC signal. At 1106, a microfluidic chip located on the lab-on-a-chip device is supplied with the DC signal(s) and the AC signal(s). The process 1100 that is illustrated in FIG. 11 enables the generation of power at the lab-on-a-chip device using photoconductive and photovoltaic components that reside on the lab-on-a-chip device and are responsive to a light from one or more external sources.

Figure 12:
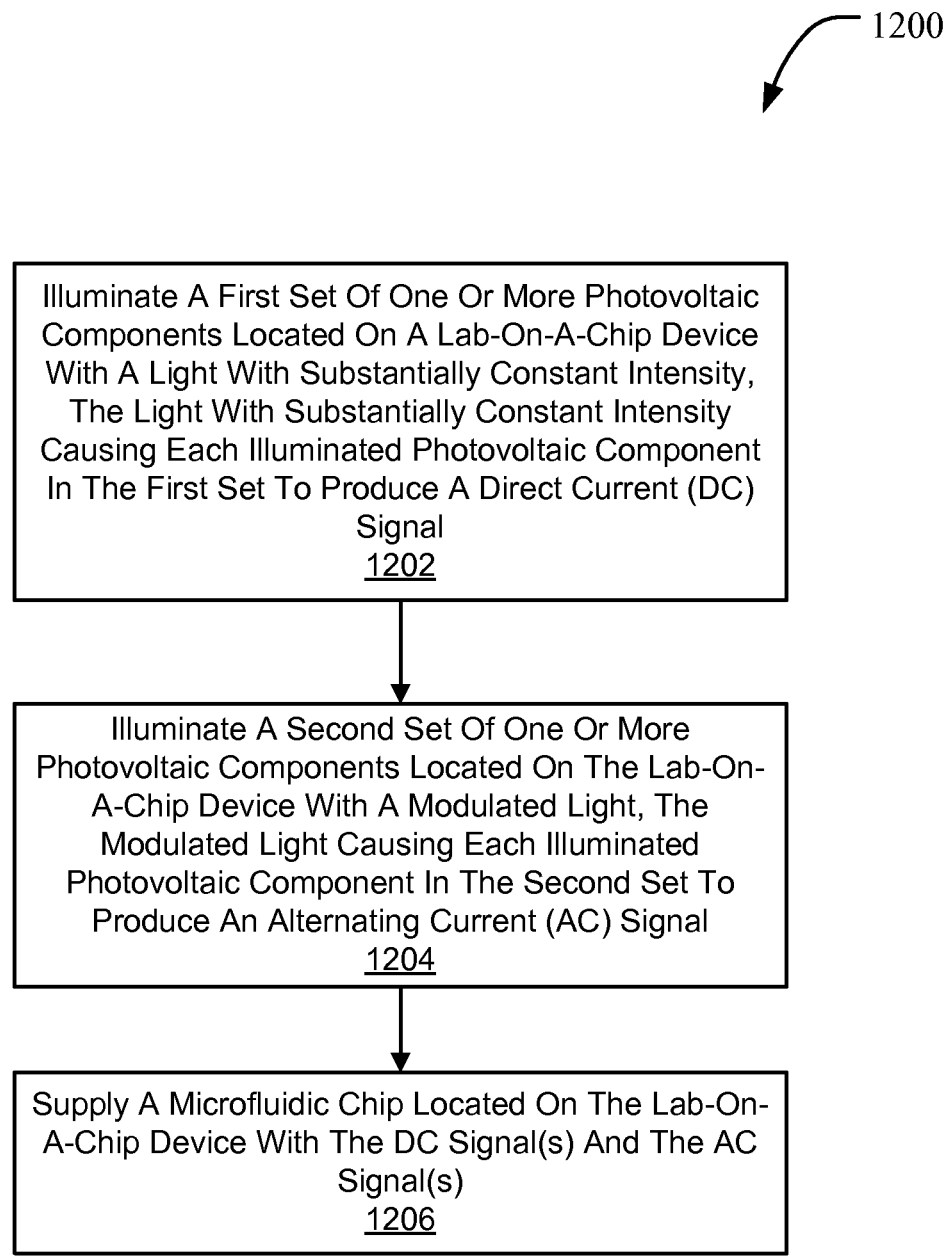
FIG. 12 illustrates a process for generating power on a lab-on-a-chip device in accordance with another exemplary embodiment.

FIG. 12 illustrates a process 1200 for generating power on a lab-on-a-chip device in accordance with another exemplary embodiment. At 1202, a first set of one or more photovoltaic components located on a lab-on-a-chip device are illuminated with a light with substantially constant intensity. The light with substantially constant intensity causes each illuminated photovoltaic component in the first set to produce a direct current (DC) signal. At 1204, a second set of one or more photovoltaic components located on the lab-on-a-chip device are illuminated with a modulated light. The modulated light causes each illuminated photovoltaic component in the second set to produce an alternating current (AC) signal. At 1206, a microfluidic chip located on the lab-on-a-chip device is supplied with the DC signal(s) and the AC signal(s). The process 1200 that is illustrated in FIG. 12 enables the generation of power at the lab-on-a-chip device using photovoltaic components that reside on the lab-on-a-chip device and are responsive to a light from one or more external sources.

While this specification contains many specifics, these should not be construed as limitations on the scope of any invention or of what may be claimed, but rather as descriptions of features that may be specific to particular disclosed embodiments. Certain features that are described in this specification in the context of separate embodiments can also be implemented in combination in a single embodiment. Conversely, various features that are described in the context of a single embodiment can also be implemented in multiple embodiments separately or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombination.

Similarly, while operations are depicted in the drawings in a particular order, this should not be understood as requiring that such operations be performed in the particular order shown or in sequential order, or that all illustrated operations be performed, to achieve desirable results. Moreover, the separation of various system components in the embodiments described above should not be understood as requiring such separation in all embodiments. Only a few implementations and examples are described and other implementations, enhancements and variations can be made based on what is described and illustrated in this application.

What is claimed is:

1. A lab-on-a-chip device, comprising:
   a microfluidic chip;
   an antenna configured to receive a radio frequency (RF) signal and to produce a first alternating current (AC) signal;
   a rectifier configured to convert the first AC signal into a direct current (DC) signal; and
   one or more photoconductive components, each photoconductive component configured to convert the DC signal into an AC signal when illuminated by a modulated light, and to provide the AC signal to the microfluidic chip.

2. The lab-on-a-chip device of claim 1 wherein the antenna is configured to receive the RF signal from a wireless RF transmitter located outside the lab-on-chip device and configured to transmit the RF signal to the antenna.

3. The lab-on-a-chip system of claim 1, wherein the modulated light is produced by one or more light sources located outside the lab-on-a-chip device and configured to illuminate the one or more photoconductive components.

4. The lab-on-a-chip device of claim 3, wherein the one or more light sources comprise at least one of a light-emitting diode and a semiconductor laser diode.

5. The lab-on-a-chip device of claim 1, wherein the modulated light is an intensity-modulated light.

6. The lab-on-a-chip system device of claim 1, wherein the AC signal produced by a photoconductive component has a similar waveform as intensity of the modulated light incident upon the corresponding photoconductive component.

7. The lab-on-a-chip device of claim 1, wherein the one or more photoconductive components are configured to produce a plurality of AC signals each having a different frequency.

8. The lab-on-a-chip device of claim 1, wherein the one or more photoconductive components are configured to produce the AC signal at one particular frequency.

9. The lab-on-a-chip device of claim 1, wherein a frequency of the AC signal(s) produced by the one or more photoconductive components depends on a frequency of the modulated light and a time contestant associated with resistive and capacitive elements of the lab-on-a-chip device.

10. The lab-on-a-chip device of claim 1, wherein the microfluidic chip is configured to receive a particular DC signal from at least one of: the rectifier and the one or more photoconductive components.

11. The lab-on-a-chip device of claim 1, further comprising additional integrated circuits configured to process data obtained from the microfluidic chip and to provide the processed data to the antenna for wireless transmission to an RF transceiver.

12. The lab-on-a-chip device of claim 11, wherein the RF transceiver is a radio frequency identification (RFID) transceiver configured to receive the data in accordance with RFID protocols.

13. The lab-on-a-chip device of claim 1, wherein the one or more photoconductive components comprise one or more semiconductors or polymers.

14. The lab-on-a-chip device of claim 1, wherein the one or more photoconductive components comprise hydrogenated amorphous silicon (a-Si:H) layer.

15. The lab-on-a-chip device of claim 14, wherein the a-Si:H layer is placed between a heavily doped a-Si:H layer and one of a silicon nitride or a silicon oxide layer.

16. The lab-on-a-chip device of claim 15, wherein the heavily doped a-Si:H layer facilitates transport of photoexcited carriers, and the silicon nitride or a silicon oxide layer operates as an insulating layer and a blocking capacitor to remove a DC level shift associated with the AC signal that is produced by the one or more photoconductive components.

17. The lab-on-a-chip device of claim 15, wherein the a-Si:H layer, the heavily doped a-Si:H layer and the silicon nitride or silicon oxide layers are fabricated using one of: a chemical vapor deposition technique, a plasma-enhanced chemical vapor deposition (PECVD) technique, and a hot-wire chemical vapor deposition (HWCVD) technique.

18. The lab-on-a-chip device of claim 15, wherein the heavily doped a-Si:H layer is connected to a top indium-tin oxide (ITO) electrode and the silicon nitride or silicon oxide layer is connected to a bottom metal electrode.

19. The lab-on-a-chip device of claim 1, wherein the one or more photoconductive components comprise a thin film of heterojunction (BHJ) polymer.

20. The lab-on-a-chip device of claim 19, wherein the thin film of heterojunction (BHJ) polymer comprises a mixture of P3HT:PCBM.

21. The lab-on-a-chip device of claim 19, wherein the thin film of heterojunction (BHJ) polymer is configured to generate photo-induced charge carriers by transfer of excitons at a donor/acceptor interface.

22. The lab-on-a-chip device of claim 20, wherein the one or more photoconductive components further comprise a lithium fluoride (LiF) layer that is configured to serve as a protection layer to prevent exposure of the thin film of heterojunction (BHJ) polymer to water and oxygen.

23. The lab-on-a-chip device of claim 22, wherein the one or more photoconductive components further comprise a conductive polymer PEDOT:PSS layer configured to provide an interfacial buffer layer to smoothen roughness of a metal electrode.

24. The lab-on-a-chip device of claim 20, wherein the mixture of P3HT:PCBM thin film is spin-coated at a relatively low temperature.

25. The lab-on-a-chip device of claim 19, wherein the one or more photoconductive components are fabricated over a large-area or on flexible polymer substrates through a continuous roll-to-roll coating process.

26. The lab-on-a-chip device of claim 20, wherein conjugated polymers with different bandgap structures are fine-tuned by replacing the P3HT with PCBM as a photoconductive layer to alter a spectral response of each of the one or more photoconductive components.

27. The lab-on-a-chip device of claim 1, wherein the microfluidic chip is configured to utilize the DC signal to produce an electrophoresis (EP) effect to drive charged biomolecules in the microfluidic chip.

28. A method for wirelessly powering a lab-on-a-chip device, comprising:
receiving a radio frequency (RF) signal that is generated outside the lab-on-a chip device at an antenna located on a lab-on-a-chip device;
producing a first alternating current (AC) signal from the received RF signal;
rectifying the first AC signal, using a rectifier located on the lab-on-a-chip device, to produce a direct current (DC) signal that is provided to one or more photoconductive components located on the lab-on-a-chip device;
illuminating the one or more photoconductive components with a modulated light, the modulated light causing each illuminated photoconductive component to convert the DC signal into an AC signal; and
supplying the AC signal to power a microfluidic chip located on the lab-on-a-chip device.

* * * * *